United States Patent
Akasaki et al.

(10) Patent No.: US 6,735,129 B2
(45) Date of Patent: May 11, 2004

(54) SEMICONDUCTOR INTEGRATED CIRCUIT DEVICE

(75) Inventors: Hiroshi Akasaki, Ome (JP); Shuichi Miyaoka, Hannou (JP); Yuji Yokoyama, Ome (JP); Masatoshi Hasegawa, Ome (JP); Kozaburo Kurita, Ome (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/153,525

(22) Filed: May 24, 2002

(65) Prior Publication Data

US 2002/0176292 A1 Nov. 28, 2002

(30) Foreign Application Priority Data

May 28, 2001 (JP) .................................. 2001-158449

(51) Int. Cl.[7] .................................................. G11C 7/00
(52) U.S. Cl. ............. 365/194; 365/189.05; 365/189.08; 365/233
(58) Field of Search ............................ 365/194, 189.05, 365/189.08, 225.7, 233

(56) References Cited

U.S. PATENT DOCUMENTS 6,124,064 A * 9/2000 Kim et al. .................. 365/193
6,229,757 B1 * 5/2001 Nagata et al. ............... 365/233
6,417,715 B2 * 7/2002 Hamamoto et al. ......... 327/291

FOREIGN PATENT DOCUMENTS

JP    6-52676    2/1994

* cited by examiner

Primary Examiner—VanThu Nguyen
(74) Attorney, Agent, or Firm—Miles & Stockbridge P.C.

(57) ABSTRACT

In a semiconductor integrated circuit device that includes macro cells (circuit blocks that can be designed independently) such as a storage circuit and operates synchronously with an external clock, total delay time from signal input to output is reduced and the speed of operation is increased. In the semiconductor integrated circuit device which has plural circuit blocks coupled in series for signal transmission and whose whole operation is controlled by a clock signal, the semiconductor integrated circuit device including first circuit blocks that receive input signals in response to a first timing signal based on a clock signal, and a second circuit block that forms output signals in response to a second timing signal based on the clock signal, a time difference between the first timing signal and the second timing signal is set to a non-integral multiple of the cycle of the clock signal.

18 Claims, 12 Drawing Sheets

SEMICONDUCTOR INTEGRATED CIRCUIT DEVICE

BACKGROUND OF THE INVENTION

The present invention relates to technology for increasing the speed of operation of a semiconductor integrated circuit device which has plural circuit blocks coupled in series for signal transmission and whose whole operation is controlled by a clock signal. More particularly, the present invention relates to technology effectively used for a semiconductor integrated circuit device that has storage circuit blocks such as DRAM and logic circuit blocks on one semiconductor integrated circuit chip and is configured so that a data transfer within the chip is performed synchronously with a clock signal.

In a conventional logic LSI (large-scale semiconductor integrated circuit) in which a storage circuit and logic circuits are formed on a one semiconductor chip, generally a data transfer within the chip is often performed synchronously with a clock signal. For such LSI, when data is transferred from one function circuit to another, inputted data is properly processed before being stored in an internal storage circuit, or data read from the storage circuit is properly processed before being outputted to the outside of the chip, a circuit to receive the data is configured to latch the data synchronously with the rising edge or falling edge of a clock signal (hereinafter referred to simply as a clock). For this reason, it has been common that time required for a data transfer is an integral multiple of the cycle of the clock.

SUMMARY OF THE INVENTION

Data propagation delay time occurring during use of circuits such as function circuits may, in some cases, be shorter than one cycle of clock, or in other cases, be a little longer than one cycle of clock, depending on the characteristics of circuits concerned, or the distance of data transfer. Even in such cases, in conventional semiconductor integrated circuit devices, data receive has been performed by latching data on the rising edge or falling edge of a clock whose phase matches that of an internal clock. As a result, time required for data transfer or data transmission is an integer multiple of one cycle of clock, and data has been transferred about one cycle later than actual delay.

If all internal timing signals are adjusted at an optimum timing according to data transfer delay within the chip, the timing of output signals may not match the phase of clock. If such signals are outputted to the outside of the chip, other LSIs that receive the signals and operate synchronously with an external clock could not correctly get the signals. Accordingly, semiconductor integrated circuit devices operating synchronously with a clock must synchronize with the clock at an input end and output end of signal.

Moreover, in the design and development of LSI for which high speed operation is demanded, the LSI is designed so that the margins of setup time and hold time for a clock are minimized to increase its operation speed. However, if the margins are thus minimized, a slight timing lag occurs in an internal clock due to change of element characteristics and parasitic capacity caused by variations in processes, and the slight timing lag of the internal clock may cause circuits to malfunction. In such a case, the manufacturing yield of a semiconductor integrated circuit decreases or its design must be changed. Accordingly, it is desirable that the LSI chip is internally provided with a mechanism by which clock timing can be adjusted at a final stage of process.

As a prior art related to the present invention, according to the invention disclosed in Japanese Published Unexamined Patent Application No. Hei 6(1994)-52676, in a semiconductor integrated circuit device including a storage circuit, optimum setup time and write pulse width are adjusted using a fuse circuit to speed up processing. However, the prior invention, which relates to technology for adjusting signal timing within RAM used as a storage circuit, makes no disclosure of adjusting transmission timing of signals between the RAM and logic circuits comprised of gate arrays and the like on the periphery of the RAM by changing a clock delay. In the prior patent application, although a fuse circuit is used to adjust timing, no disclosure is made of a method of forming the fuse.

An object of the present invention is to reduce total signal propagation delay time from signal input to output and speed up processing in a semiconductor integrated circuit device that includes circuit blocks such as storage circuits and operates synchronously with an external clock.

Another object of the present invention is to provide a semiconductor integrated circuit device that becomes fewer in the number of design changes and the number of mask modifications, is greatly reduced in development period, and is increased in yield.

Another object of the present invention is to provide a semiconductor integrated circuit device which allows timing to be adjusted without using much time for process changes and clock timing adjustment, and causes no increase in costs.

The above described objects and other objects, and novel characteristics of the present invention will become apparent from the description of this specification and the accompanying drawings.

Of inventions disclosed in the present patent application, typical ones are outlined below.

In the semiconductor integrated circuit device which has plural circuit blocks coupled in series for signal transmission and whose whole operation is controlled by a clock signal, the semiconductor integrated circuit device including first circuit blocks (131, 141, 132, and 142) that receive input signals in response to a first timing signal ($\phi 1$) based on a clock signal (CLK), and a second circuit block (110) that forms output signals in response to a second timing signal ($\phi 2$) based on the clock signal, a time difference between the first timing signal and the second timing signal is set to a non-integral multiple of the cycle of the clock signal.

According to the above described means, in any portion of the second circuit block in which signal transmission time is not an integral multiple of the cycle of clock, operation is performed based on a timing signal generated to conform to the signal transmission time, whereby total delay time from signal input to output can be reduced and the speed of operation can be increased.

Preferably, time from the acceptance of an input signal in the first circuit blocks to the output of a signal formed in the second circuit block is set to an integral multiple of the cycle of the clock signal. In other words, in a semiconductor integrated circuit device which has a signal input point, a signal output point, and plural circuit blocks provided in series between the signal input point and the signal output point and in which the timings of a signal input operation from the signal input point, a signal output operation at the signal output point, and a signal transmission operation among the plural circuit blocks are respectively controlled by timing signals, when the clock signal cycle is T1, the total of signal response periods of individual circuit blocks of the plural circuit blocks is T2, and the ratio T2/T1 between T1 and T2 is n+α (n is an integer and α is a positive number equal to or less than 1), a signal response period from the signal input point to the signal output point is set to n+1 times the clock signal cycle T1. This facilitates synchronization with other semiconductor integrated circuit devices to receive output signals from a semiconductor integrated circuit device to which the present invention is applied, and facilitates the design of a board system and the like.

Moreover, preferably, a timing signal forming circuit is provided which forms the first timing signal and the second timing signal, based on the clock signal, and the timing signal forming circuit has a program element and includes a delay circuit for adjusting the time difference between the first timing signal and the second timing signal by the program element. Thereby, even after the semiconductor integrated circuit device has been manufactured, internal timings can be adjusted, a large margin can be provided for the signal transmission system, and product yield can be increased. The above described program element, which can be formed in various forms, is preferably comprised of fuse devices in terms of circuit occupation area.

In the case where at least one of the above described circuit blocks has a circuit operation setting element and the setting of its circuit operations is changeable depending on the circuit operation setting element, the program element in the delay circuit and the circuit operation setting element in the first circuit blocks are configured with devices having the same configuration as each other. Thereby, a semiconductor integrated circuit device can be obtained which includes a delay circuit capable of adjusting timing without any change of processes.

In the case where the second circuit block is comprised of a random access memory having a defect relieving circuit, the program element in the delay circuit and a setting element for holding defect relief information in the defect relieving circuit in the second circuit block are configured with devices having the same configuration as each other. Thereby, in a semiconductor integrated circuit device including a memory having a redundant circuit, a delay circuit capable of adjusting internal timing can be mounted on an identical chip without any change of processes.

The program element in the delay circuit and the setting element for holding defect relief information in the defect relieving circuit in the second circuit block are provided adjacently to each other. Thereby, program processing such as disconnection by laser irradiation or the like can be performed easily and quickly.

In this case, the program element in the delay circuit and the setting element for holding defect relief information in the defect relieving circuit are nearly linearly juxtaposed. Thereby, program processing can be performed more efficiently.

According to the present invention, in a semiconductor integrated circuit device which has plural circuit blocks coupled in series for signal transmission and whose whole operation is controlled by a clock signal, the plural circuit blocks include a first circuit block and a second circuit block that receive input signals in response to a first timing signal based on the clock signal, and a third circuit block that forms output signals in response to a second timing signal based on the clock signal; in a signal transmission system, the third circuit block is provided between the first circuit block and the second circuit block; and a time difference between the first timing signal and the second timing signal is set to a period of a non-integral multiple of the cycle of the clock signal.

According to the above described means, in any portion of the third circuit block in which signal transmission time is not an integral multiple of the cycle of clock, operation is performed based on a timing signal generated to conform to the signal transmission time, whereby total delay time from signal input to output can be reduced and the speed of operation can be increased. Moreover, signals can be outputted synchronously with the clock signal from the second block, facilitating synchronization with other semiconductor integrated circuit devices to receive output signals from a semiconductor integrated circuit device to which the present invention is applied, and easing the design of a board system and the like.

The third circuit block includes a local timing signal generating circuit that generates a third timing signal within the block, based on the second timing signal, and a time difference between the second timing signal and the third timing signal may be a non-integral multiple of the cycle of the clock signal. Since the constraint that a time difference is an integral multiple of the cycle of clock signal is eliminated, operation is performed according to timing reflecting actual delay time, whereby signals can be transmitted at high speed.

The local timing signal forming circuit has a program element and includes a delay circuit for adjusting the time difference between the second timing signal and the third timing signal by the program element. Thereby, even after the semiconductor integrated circuit device has been manufactured, internal timings can be adjusted, a large margin can be provided for a signal transmission system, and product yield can be increased.

The first circuit block and the second circuit block each include a latch circuit that gets input signals to the respective circuit blocks, based on the first timing signal, and the third circuit block includes a latch circuit that gets input signals to the third circuit block, based on the second timing signal. By providing a latch circuit at an input side of each circuit block, synchronization can be established in the signal transmission system by a simple circuit.

In the signal transmission system consisting of the first circuit block, the third circuit block, and the second circuit block coupled in series for signal transmission, one or two or more fourth circuit blocks may be provided in parallel with the third circuit block. Thereby, system functions within the chip can be made advanced, and even if such advanced functions have been achieved, total delay time from signal input to output can be reduced and the speed of operation can be increased.

In the case where the third circuit block and the fourth circuit block have the same circuit configuration, a signal selecting means for selectively transmitting one of output signals corresponding to the circuit blocks is provided in the second circuit block. Thereby, a semiconductor integrated circuit device can be easily achieved in which plural memory circuits such as RAM are mounted.

In the case where a timing signal forming circuit is which forms the first timing signal and the second timing signal, based on the clock signal, the timing signal forming circuit has a program element and includes a delay circuit for adjusting the time difference between the first timing signal and the second timing signal by the program element. Thereby, even after the semiconductor integrated circuit device has been manufactured, internal timings can be adjusted, a large margin can be provided for the signal transmission system, and product yield can be increased.

There are further provided two external terminals through which the clock signal is inputted, and a clock buffer circuit which receives a differential clock signal inputted to the two external terminals and generates a single-phase clock signal. Thereby, timing can be decided at cross points of positive-phase signal and negative-phase signal of differential clock signals, so that clock skew can be minimized and a highly reliable semiconductor integrated circuit device can be obtained.

DETAILED DESCRIPTION OF THE PREFERRED EMBODIMENTS

Hereinafter, preferred embodiments of a semiconductor integrated circuit device of the present invention will be described with reference to the accompanying drawings.

Figure 1:
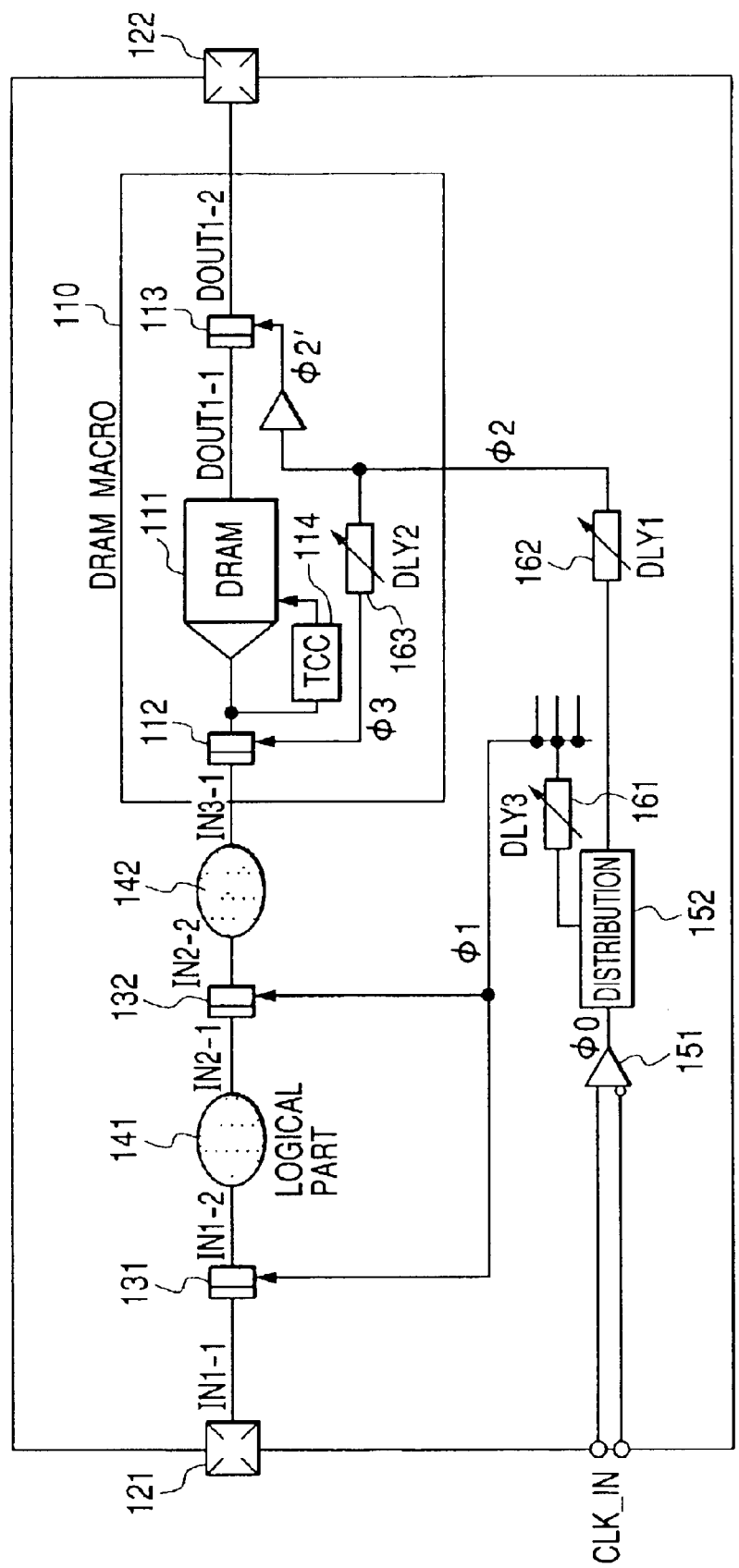
FIG. 1 is a diagram schematically illustrating the configuration of a first embodiment of a semiconductor integrated circuit device to which the present invention is applied.

FIG. 1 is a diagram schematically illustrating the configuration of a first embodiment of a semiconductor integrated circuit device that includes a storage circuit and operates synchronously with a clock supplied from the outside.

In this embodiment, a macro cell 110 comprised of DRAM (dynamic random access memory) whose memory cells are dynamic memory cells is included as a storage circuit, and between an input terminal 121 of the chip and an input terminal of the DRAM macro cell 110 are provided a first latch circuit 131 serving as a synchronizing circuit that latches an input signal synchronously with an internal clock $\phi1$, a first logic part 141 comprising a combination logic and the like that processes a latched signal, a second latch circuit 132 serving as a synchronizing circuit that latches a signal processed in the first logic part 141 synchronously with the internal clock $\phi1$, and a first logic part 142 comprising a combination logic and the like that processes a latched signal.

In this specification, the term macro cell refers to a unified circuit that has a predetermined function and is designed independently from other circuit blocks, or a circuit block registered in a database after being designed and evaluated. The macro cell can be immediately mounted on the chip to function effectively, and is a circuit larger in scale than logical gate circuits such as NAND gate and NOR gate, and basic constituent circuits such as flip-flop circuits. Although, in this embodiment, DRAM is used as a macro cell, without being limited to this, the present embodiment can also apply to cases where a circuit other than memory performing dynamic operations according to timing signals is included as a macro cell.

In this embodiment, the following components are optionally provided: a clock buffer 151 that, upon receipt of a differential clock CLK supplied from the outside, shapes its waveform and outputs a single-phase internal clock $\phi0$; a clock distribution circuit 152 comprised of an inverter and the like that distributes the internal clock $\phi0$ to parts of a chip; a first variable delay circuit 161 that generates a first local clock $\phi1$ as a first timing signal for delaying one of distributed clocks and affording latch timing to the latch circuits 131 and 132; and a second variable delay circuit 162 that generates a second local clock $\phi2$ as a second timing signal for delaying another clock of the distributed clocks and affording operation timing to the DRAM macro cell 110.

Moreover, the DRAM macro cell 110 is provided with a third variable delay circuit 163 that generates a cell clock $\phi3$ for affording input latch timing in the DRAM, based on a second local clock $\phi2$ generated in the second variable delay circuit 162. Also, the DRAM macro cell 110 is provided with: a DRAM core part 111 comprising memory basic function circuits such as a memory array, a word line driving circuit, a column switch, and a sense amplifier; a latch circuit 112 for latching input signals such as address signal and data signal; an output latch circuit 113 for latching read data from the DRAM core part 111; and a timing control circuit 114 for generating an operation timing signal within the DRAM macro cell 11 according to input signals.

In the present embodiment, on the presumption that a period from a latch point of the first latch circuit 131 to an output point of the DRAM macro cell 110 is just an integral multiple of the cycle of the clock $\phi1$, a time difference or phase difference between the first local clock $\phi1$ and the second local clock $\phi2$ is set to a non-integral multiple of the cycle of the clock $\phi1$. Thereby, in the DRAM macro cell 110, timing design can be made without being bound to the condition that a data transfer is performed in an integral multiple of the cycle of the clock $\phi1$.

As a result, even in locations where fractions would occur if signal delay time is expressed in cycles of the clock $\phi1$, a timing signal can be generated to correspond to real delay time to speed up processing within the macro cell 110, and an operation speed of the whole semiconductor integrated circuit, that is, a time after a signal is inputted until a desired signal is outputted can be reduced (reduction in the number of cycles). Yet, since a period from a latch point of the first latch circuit 131 to an output point of the DRAM macro cell 110 is just an integral multiple of the cycle of the clock φ1, a correct data transfer can be guaranteed in the case where a system to take synchronization with other LSIs by clocks is configured. Since the semiconductor integrated circuit device is configured to receive clocks CLK supplied from the outside as differential signals, even if the signals rise or fall with delay, since timing can be decided at cross points of the differential signals, cross skew can be minimized.

Figure 4:
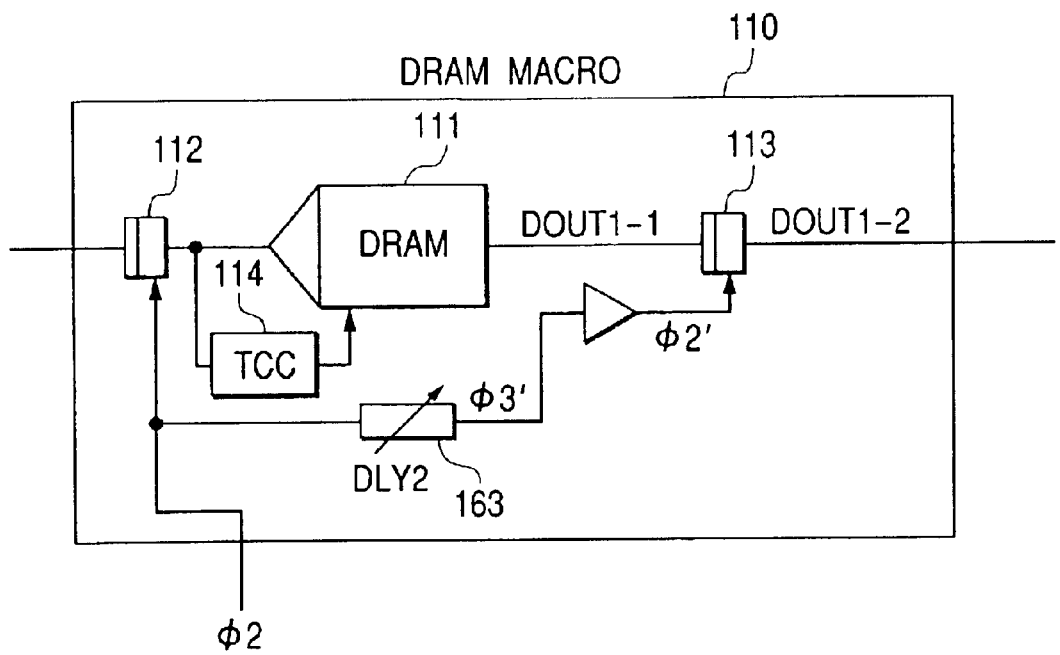
FIG. 4 is a block diagram showing another configuration of a DRAM macro cell included in the semiconductor integrated circuit device to which the present invention is applied.

In the embodiment of FIG. 1, the cell clock φ3 for affording input latch timing in the DRAM, based on a second local clock φ2 is generated by the third variable delay circuit 163 provided within the DRAM macro cell 110. However, as shown in FIG. 4, by using the second local clock φ2 as an input latch timing signal, the second local clock φ2 may be properly delayed by the third variable delay circuit 163 to generate a cell clock φ3' for affording output latch timing.

In FIG. 1, the third variable delay circuit 163 for generating the cell clock φ3 for affording input latch timing based on the second local clock φ2 for affording output latch timing is provided. This is not intended to make input latch later than output latch. In terms of operation cycle, output latch is always later than input latch. In a DRAM macro cell shown in an embodiment as described later, generating the cell clock φ3 for delaying the clock φ2 to afford input latch timing makes delay time in the third variable delay circuit 163 smaller and makes circuit size smaller. If circuit size does not need to be considered, as shown in FIG. 4, by the third variable delay circuit 163, a cell clock φ3' for delaying the second local clock φ2 to afford output latch timing may be generated.

In the embodiment of FIG. 1, in a state in which a period from a latch point of the first latch circuit 131 to an output point of the DRAM macro cell 110 is set to be just an integral multiple of the cycle of the clock φ0 by adjusting delay times of the first variable delay circuit 161 and the second variable delay circuit 162, an operation margin of the DRAM macro cell 110 can be adjusted by adjusting delay time in the third variable delay circuit 163. Specifically, for example, if access time of the DRAM macro cell is shorter than anticipated and input latch timing is to be delayed to increase an input setup margin, delay time DLY2 in the third variable delay circuit 163 is set small. Thereby, without changing the period from latch timing of the first latch circuit 131 to output timing of the DRAM macro cell 110, operation timing within the DRAM macro cell 110 can be adjusted.

Although, in the present embodiment, a clock CLK is supplied from the outside, a clock generating circuit including a oscillating circuit may be provided within the semiconductor integrated circuit so that a first local clock is generated based on a clock generated in the clock generating circuit and the clock is outputted to the outside of the chip to establish synchronization with other semiconductor integrated circuits.

Figure 2:
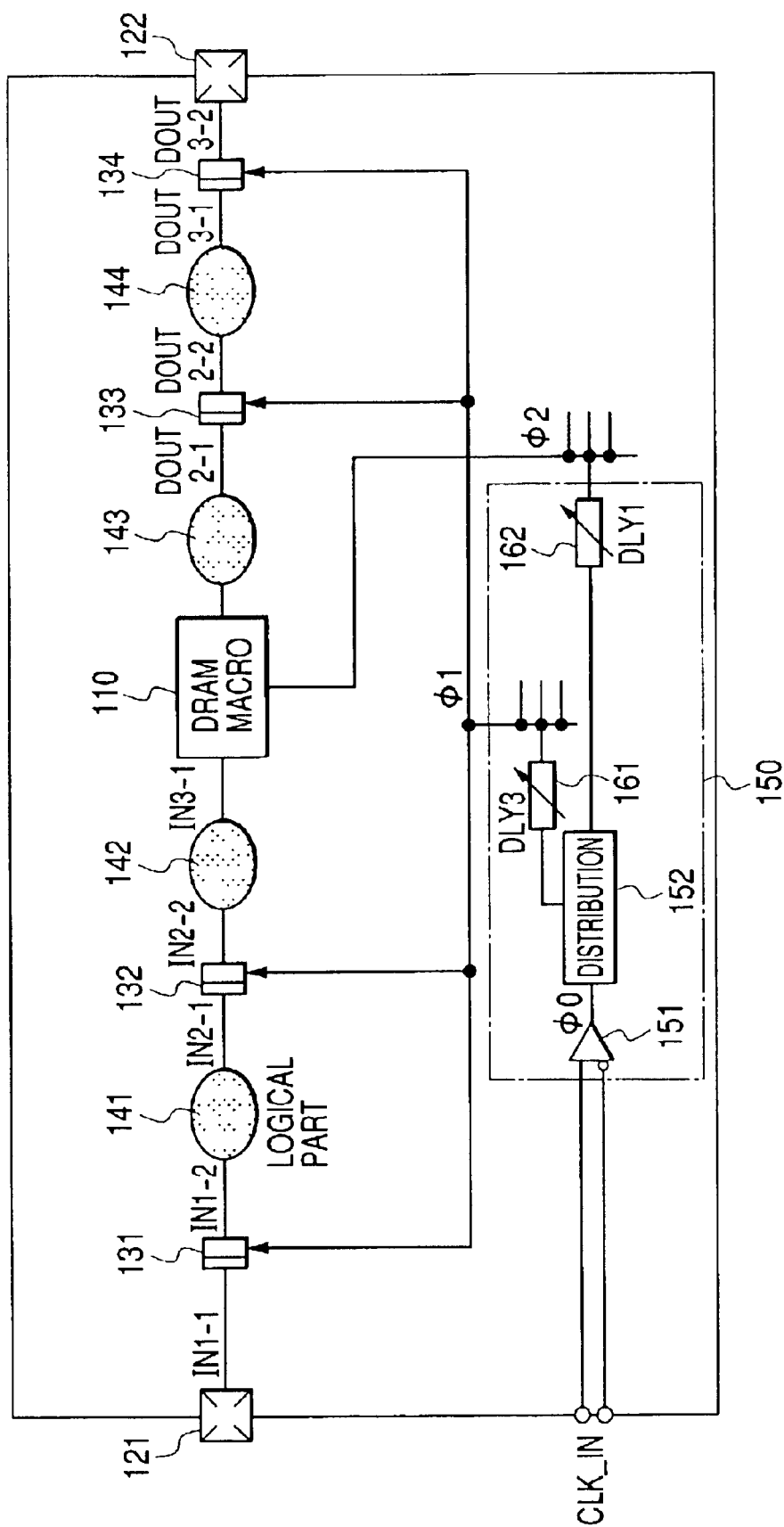
FIG. 2 is a diagram schematically illustrating the configuration of a second embodiment of the semiconductor integrated circuit device to which the present invention is applied.

FIG. 2 is a diagram schematically illustrating the configuration of a second embodiment of the present invention. In this embodiment, between an output terminal of the DRAM macro cell 110 in the first embodiment shown in FIG. 1 and an output terminal 122 of the semiconductor chip are provided a third logic part 143 comprising a combination logic that processes a data signal read from the DRAM macro cell 110, a third latch circuit 133 serving as a synchronizing circuit that latches a signal processed by the third logic part 143 synchronously with the internal clock φ1, a fourth logic part 144 comprising a combination logic that processes a latched signal, and a fourth latch circuit 134 serving as a synchronizing circuit that latches a signal processed by the third logic part 144 synchronously with the internal clock φ1. Since an internal configuration of the DRAM macro cell 110 is the same as that in FIG. 1, its diagram is omitted.

Although, in the embodiment, the DRAM macro cell 110 is followed by two logic parts and two latch circuits, an embodiment is also conceivable in which only the logic part 143 and the latch circuit 133 are provided. Likewise, although, in the embodiment of FIG. 2, the DRAM macro cell 110 is preceded by two latch circuits and two logic parts, an embodiment is also conceivable in which only the latch circuit 131 and the logic part 141 are provided.

Figure 3:
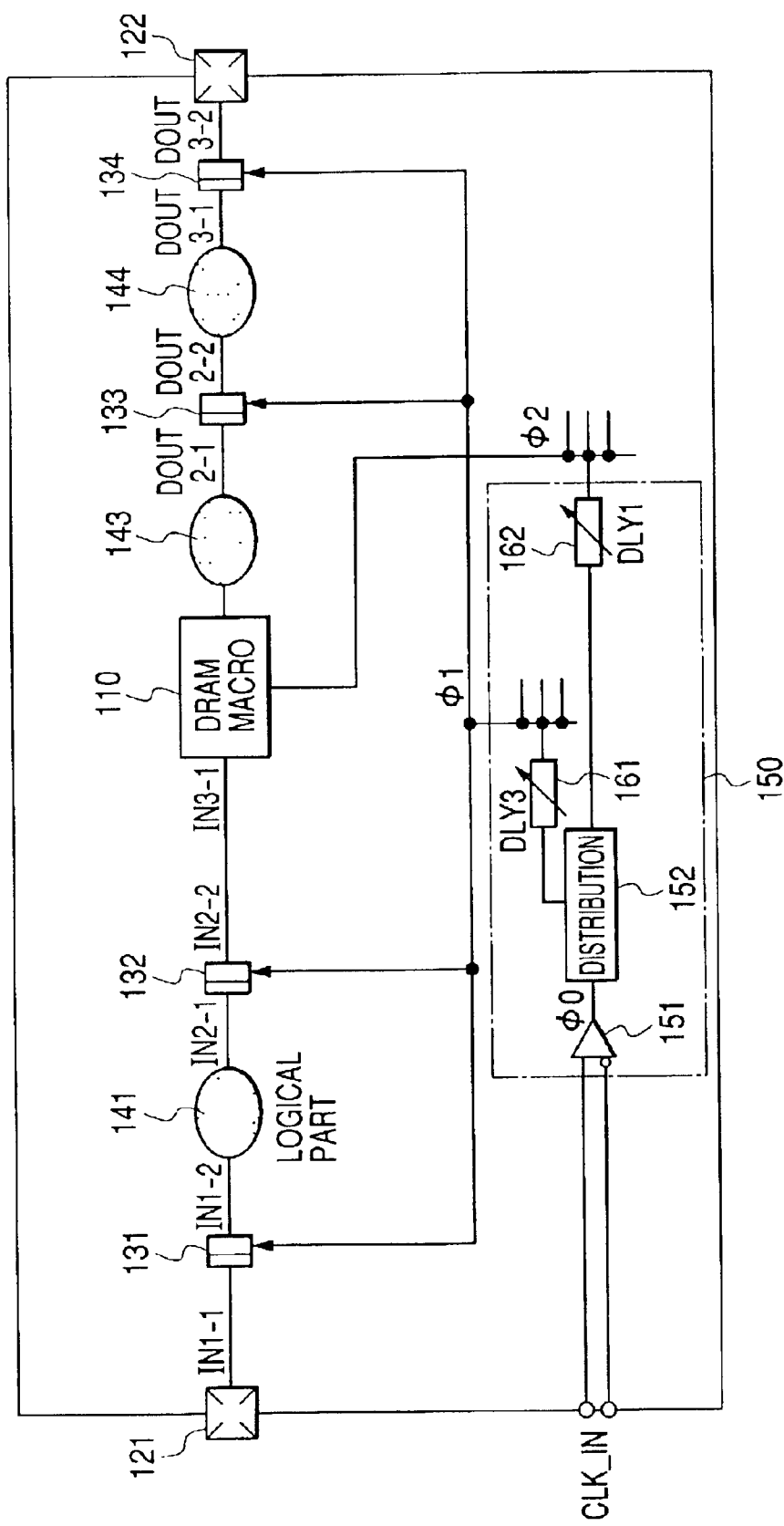
FIG. 3 is a diagram schematically illustrating the configuration of a third embodiment of the semiconductor integrated circuit device to which the present invention is applied.

FIG. 3 is a diagram schematically illustrating the configuration of a third embodiment of the present invention. This embodiment is similar to the second embodiment shown in FIG. 2 except that the second logic part 142 does not exist between the second latch circuit 132 and the DRAM macro cell 110. Since an internal configuration of the DRAM macro cell 110 is the same as that in FIG. 1, its diagram is omitted.

Also in this embodiment, a variant with the second latch circuit 132 omitted is conceivable. By providing the second latch circuit 132, timing of signals for which the number of logic stages in a signal transmission system from the input terminal 121 to the DRAM macro cell 110 is small or a logic scale therein is small can be easily brought into line with timing of input signals of other types for which the number of logic stages is large or a logic scale is large.

Figure 5:
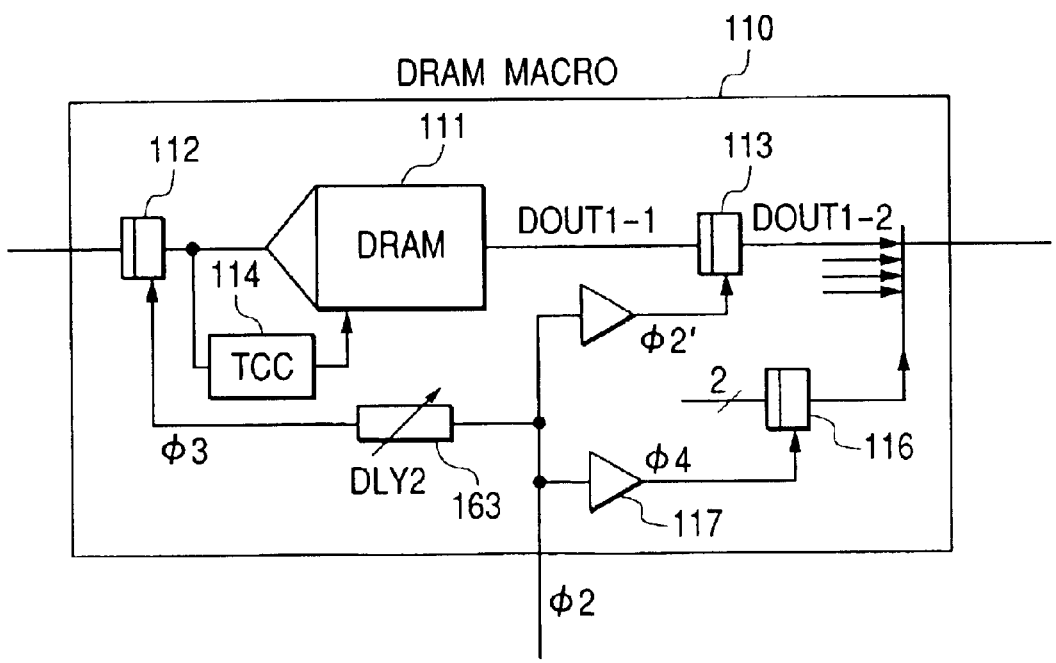
FIG. 5 is a block diagram showing another configuration of the DRAM macro cell included in the semiconductor integrated circuit device to which the present invention is applied.

FIG. 5 shows another configuration of the DRAM macro cell 110. The DRAM macro cell of this embodiment comprises a multiplexer 115 that selects and outputs, e.g., a fourth (9 bytes) the read data latched to the latch circuit 113 for latching plural bytes (e.g., 36 bytes) of data read in parallel from the DRAM core part 11, a latch circuit 116 that latches a selection control signal of the multiplexer 115, and a clock buffer 117 that generates a clock φ4 for affording latch timing of the latch circuit 116.

The clock buffer 117 generates φ4 based on the clock φ2 supplied to the DRAM macro cell 110. The clock φ4 is generated to drive the latch circuit 116 into latch operation at timing somewhat earlier than the clock φ2' for affording latch timing of the latch circuit 113 that latches read data.

Figure 6:
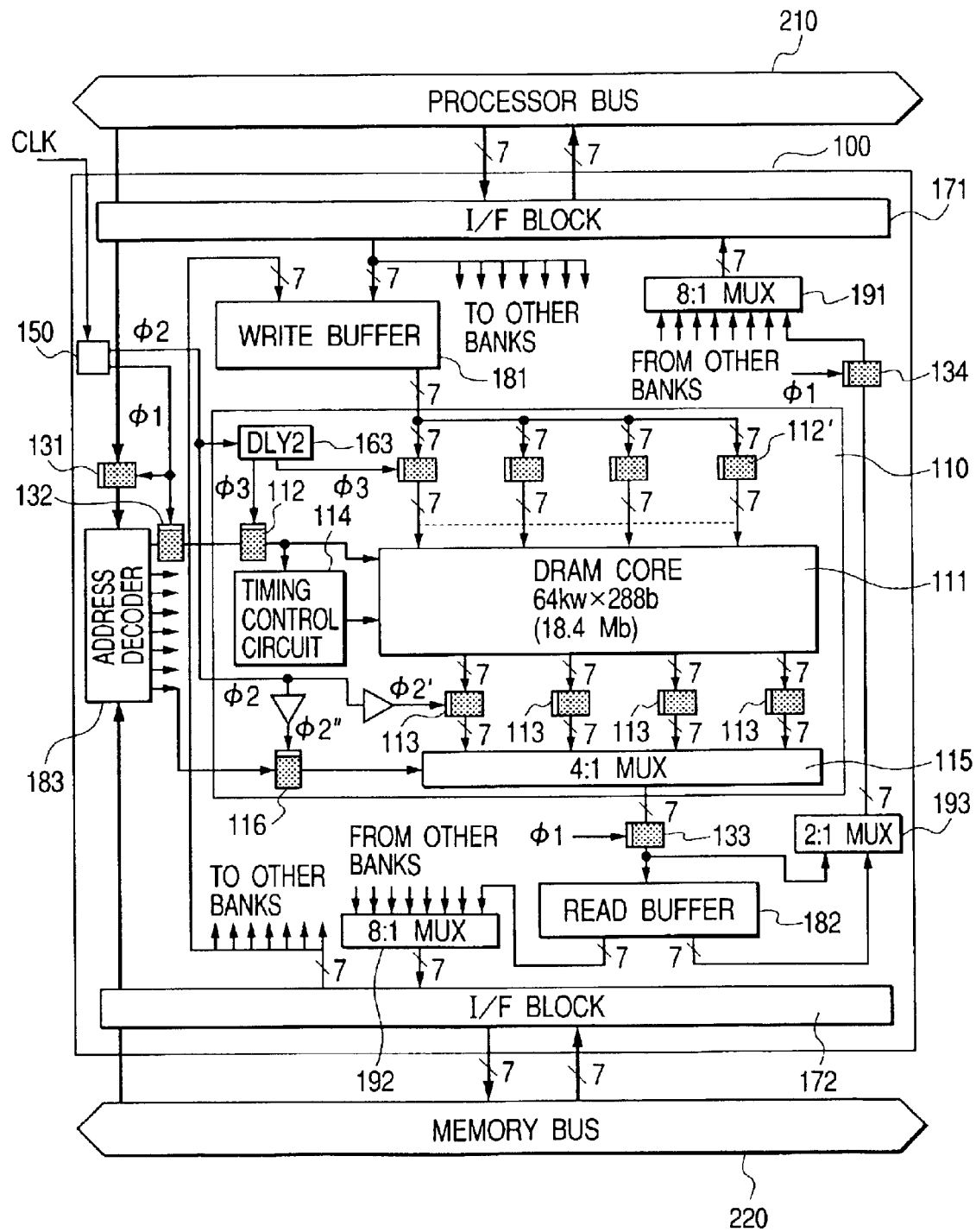
FIG. 6 is a block diagram showing an embodiment of the present invention applied to a cache memory.

FIG. 6 shows an embodiment of the present invention applied to a cache memory provided between a microprocessor and a main memory. Optionally, an internal circuit block enclosed by a solid line indicated by a reference numeral 100 is formed on a semiconductor substrate such as monocrystalline silicon.

In FIG. 6, 110 designates the DRAM macro cell as in FIG. 1. Although only one DRAM macro cell 110 is representatively shown in FIG. 6, e.g., eight macro cells each having the same configuration as the DRAM macro cell 110 are mounted on the identical chip. Each macro cell 110 has a storage capacity of 64 k words by 288 bits and is used as a bank memory (hereinafter simply referred to as a bank) to store data identical with data in an address area frequently accessed within a main memory not shown. When data required by the microprocessor is stored in any one of the banks within the cache memory, in order that desired data can be obtained faster than when read from the main memory, logic circuits around the macro cells are formed or an LSI (so-called cache controller) having such a memory management function is connected to the outside of the chip.

The DRAM macro cell 110 in this embodiment has the multiplexer 115 as shown in FIG. 5 that selects and outputs, e.g., a fourth the read data latched to the latch circuit 113. In the cache memory of FIG. 6, 171 designates an interface circuit through which signals between the cache memory 100 and a processor bus 210 to which the microprocessor is connected are inputted and outputted, and 172 designates an interface circuit through which signals between the cache memory 100 and a memory bus 220 to which the main memory is connected are inputted and outputted. 181 designates a write buffer for temporarily holding write data written to the DRAM macro cell, and 182 designates a read buffer for temporarily holding read data read from the DRAM macro cell. These buffers are provided to correspond one for one with the macro cells.

Reference numeral 183 designates an address decoder that decodes an address signal inputted from the outside and generates a signal for selecting any one of the DRAM macro cells or a signal for selecting a word line and column within a macro cell. In this embodiment, the address decoder 183 is provided as a circuit common to the eight DRAM macro cells. However, address decoders may be provided to correspond one for one with the macro cells.

Reference numeral 191 designates a multiplexer common to the banks that selects one of the eight banks from which to output read data to the processor bus 210; 192, a multiplexer common to the banks that selects one of the eight banks from which to output read data to the memory bus 220; and 193, a multiplexer, provided for each bank, that selects one of read data read from a corresponding macro cell, and read data already read from the macro cell and held in the read buffer 182, and transmits it to the multiplexer 191.

Reference numerals 131 to 134 designate latch circuits provided outside the DRAM macro cell, and 150 designates a combined circuit (hereinafter referred to as an internal clock generating circuit) of the clock buffer 151 shown in FIG. 1 that, upon receipt of a differential clock CLK supplied from the outside, shapes its waveform and outputs a single-phase internal clock $\phi 0$, and the clock distribution circuit 152 that distributes the internal clock $\phi 0$ to parts of the chip. 112' designates a write data latch circuit that gets write data held in the write buffer 181 synchronously with the write data clock $\phi 3$. Other circuits and circuit blocks in FIG. 6 that are identical with those shown in FIG. 1 are assigned identical reference numerals to avoid duplicate descriptions.

One of circuits not shown in FIG. 6 is a circuit that processes control signals such as RAS (row address strobe), CAS (column address strobe), and WE (write enable) signals inputted via the signal transmission system of the second embodiment as shown in FIG. 2. Examples of such a circuit are a combination logic circuit such as a command decoder that determines an operation mode from combinations of control signals such as RAS, CAS, and WE and generates an internal control signal for circuits within the DRAM macro cell, corresponding to the mode, and a combination logic circuit such as a distribution circuit that decides to which of DRAM macro cells the control signal generated therein is to be distributed, and outputs it.

The command decoder as described above corresponds to the first logic part 141 in FIG. 2 and the distribution circuit corresponds to the second logic part 142 in FIG. 2. The address signal transmission system shown in FIG. 6 corresponds to the third embodiment shown in FIG. 3. This is because a logic circuit corresponding to the second logic part in FIG. 2 does not exist in the embodiment of FIG. 6. However, in the case of taking a so-called redundant circuit configuration in which defective memory cells in a memory core are replaced by spare memory cells, if a circuit for setting a relief address by using fuse devices and the like, and an address comparison circuit for comparing the relief address set in the circuit and an input address signal are provided between the second latch circuit 132 and the DRAM macro cell 110 shown in FIG. 6, address signals are also inputted via the signal transmission system shown in FIG. 2.

On the other hand, the multiplexer 115 provided within the DRAM macro cell 110 of FIGS. 5 and 6 corresponds to the third logic part 143 in FIGS. 2 and 3. The multiplexer 193 in FIG. 6 corresponds to the fourth logic part 143 in FIGS. 2 and 3.

Write data during writing, without having to be subjected to logical processing, should have arrived in the DRAM macro cell at the point in time when an address signal and all control signals arrive in the DRAM macro cell. Therefore, in this embodiment, a write data signal transmission system does not correspond to any of the above described embodiments. Also for write data signals, however, a latch circuit may be provided in place of the write buffer 181 so that the write signals can be transmitted through a signal transmission system in which the first logic part 141 in the third embodiment is omitted. Or the write buffer 181 shown in FIG. 6 can be brought into operation synchronously with the clock $\phi 1$, regarded as a combined circuit of the first latch circuit 131 and the second latch circuit in FIG. 3. In this case, the write data latch circuit 112' shown in FIG. 6 can be considered to correspond to the input latch circuit 112 of address system.

In the case where the cache memory is to be provided with a function for adding ECC (error correcting code) and parity bits to the write data got into the write buffer 181, as the first logic part 141 or second logic part 142 of the write data transmission system, a corresponding logic function circuit can be provided. Moreover, in the case where an ECC check circuit and a parity check circuit are provided in the data output side, these logic circuits can be provided as the third logic part 143 or fourth logic part 144 in FIGS. 2 and 3, or a fifth logic part not shown in FIGS. 2 and 3. The fifth logic part, if provided, is desirably followed by a fifth latch circuit.

Figure 7:
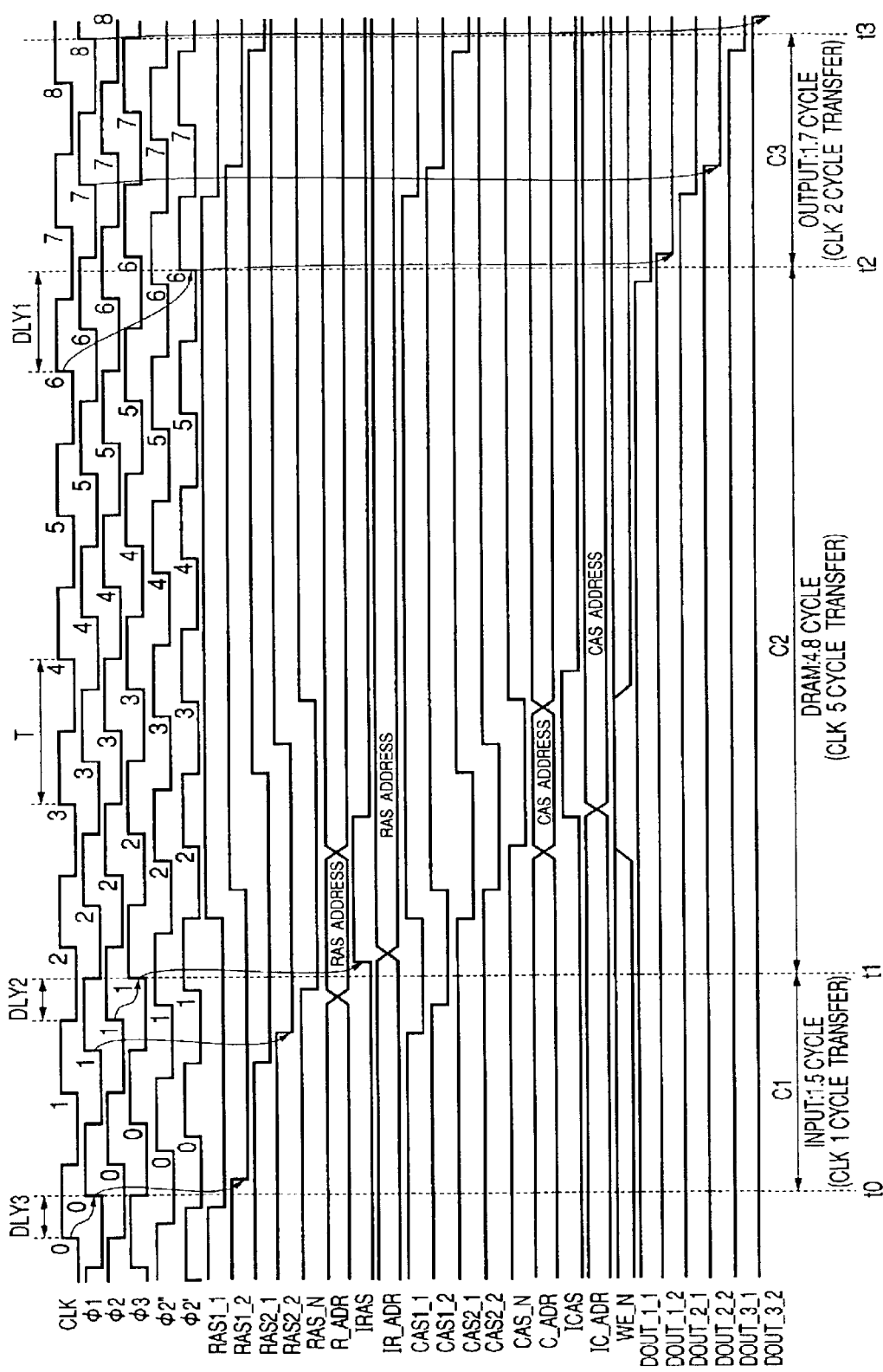
FIG. 7 is a timing chart showing timings of signals in the cache memory of the embodiment of FIG. 6.
Figure 8:
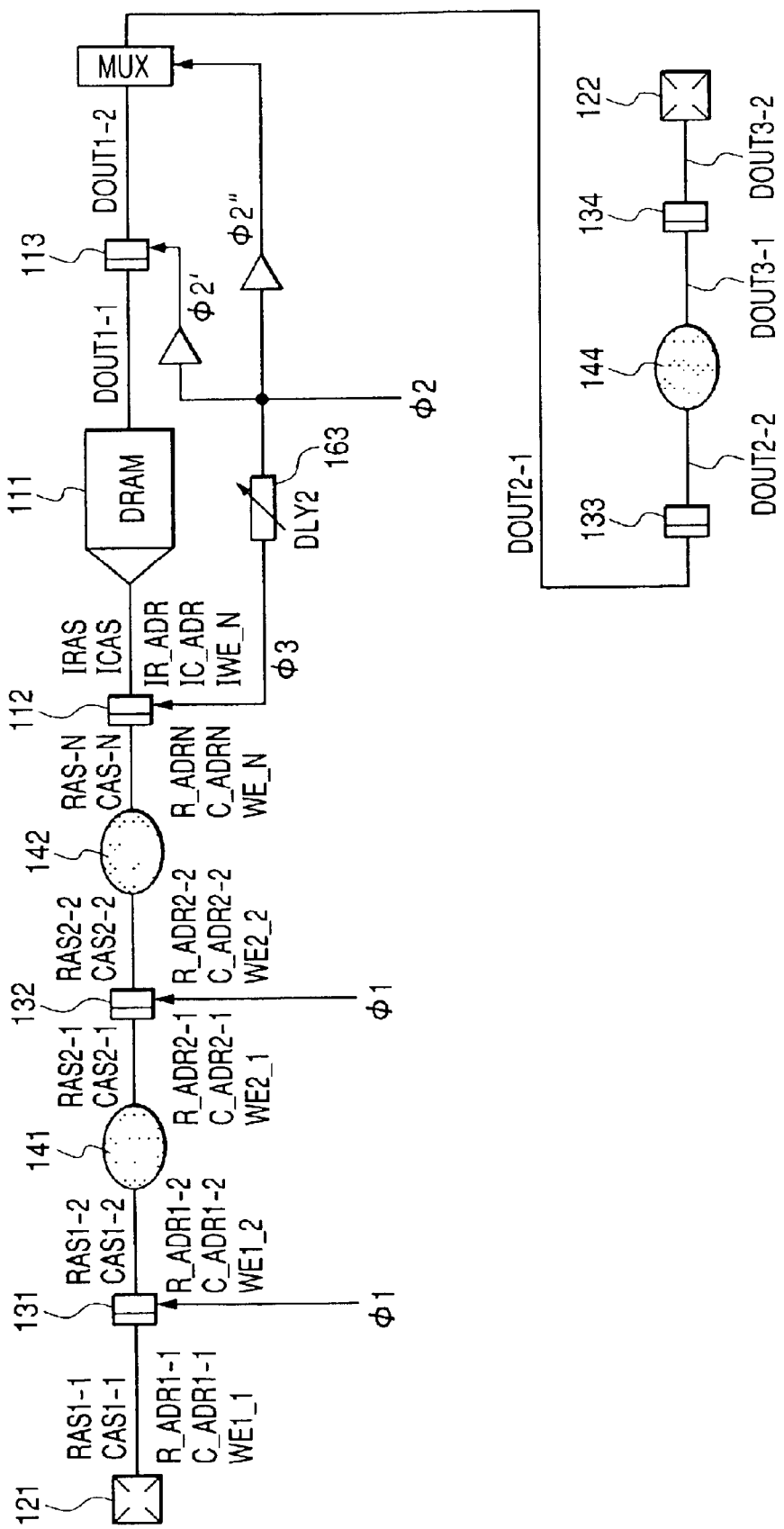
FIG. 8 is a block diagram showing the locations of signals of FIG. 7 in a signal transmission system of the embodiment of FIG. 2.

FIG. 7 shows timings of signals in the cache memory of the embodiment of FIG. 6. FIG. 8 shows the locations of the signals of waveforms shown in FIG. 7 in the signal transmission system of FIG. 2 or 3 by symbols. In FIGS. 7 and 8, symbols R_ADR and IR_ADR respectively indicate row address signals at the entrance of the DRAM macro cell, and C_ADR and IC_ADR respectively indicate column address signals at the entrance of the DRAM macro cell.

Of these signals, timings of signals R_ADR1_1, R_ADR1_2, R_ADR2_1, and R_ADR2_2 from the input terminal 121 to the entrance of the DRAM macro cell of the row address signal R_ADR are not illustrated because they are identical with those of signals RAS1_1, RAS1_2, RAS2_1, and RAS2_2 of corresponding parts of RAS signal. Timings of signals (C_ADR1_1, C_ADR1_2, C_ADR2_1, and C_ADR2_2) from the input terminal 121 to the entrance of the DRAM macro cell of the column address signal C_ADR are not illustrated because they are identical with those of signals CAS1_1, CAS1_2, CAS2_

1, and CAS2_2 of corresponding parts of CAS signal. Likewise, timings of signals WE1_1, WE1_2, WE2_1, and WE2_2 from the input terminal 121 to the entrance of the DRAM macro cell of the write enable signal WE are not illustrated because they are almost identical with those of signals CAS1_1, CAS1_2, CAS2_1, and CAS2_2 of corresponding parts of CAS signal.

As seen from the timing chart shown in FIG. 7, in the cache memory of the present embodiment, a first cycle is started by the first local clock φ1 generated based on the external clock CLK, and read data is latched to the fourth latch circuit 134 on the rising edge of the last clock φ1 of an eighth cycle. The operation of the DRAM macro cell 110 is started at the rising timing t1 of clock φ3 resulting from delaying the second local clock φ2 by DLY2 wherein the second local clock φ2 is a non-integral multiple of clock cycle out of phase with the first local clock φ1.

In this embodiment, delay time DLY1 of the delay circuit 162 and delay time DLY2 of the delay circuit 163 are set so that a period C1 from the rising timing t0 of the first local clock φ1 at the start of the first cycle to the start timing t1 (latch operation of the latch circuit 112) of the DRAM macro cell 110 is 1.5 times the cycle T of clock φ1. Delay time DLY1 of the delay circuit 162 is set so that a period C2 from the start timing t1 of the DRAM macro cell 110 to the timing t2 in which read data is latched to the latch circuit 113 is 4.8 times the cycle T of clock φ1 A period C3 from the timing t2 in which read data is latched to the latch circuit 113 until the read data is latched to the fourth latch circuit 134 of the last stage is 1.7 times the cycle T of clock φ1. As a result, a total time from the latch operation of the first latch circuit 131 to the latch operation of the fourth latch circuit 134 is eight times the cycle T of clock φ1.

As described above, although, in the cache memory of this embodiment, an operation start point of the DRAM macro cell 110 is not an integral multiple of the cycle T of clock φ1, a period (C1+C2+C3) from the latch operation of the first latch circuit 131 to the latch operation of the fourth latch circuit 134 is set to an integral multiple (eight times) of the cycle T of clock φ1. Therefore, synchronous operation with other semiconductor integrated circuits is guaranteed. Moreover, since data transfer time can be set independently of the cycle of clock φ1 within the DRAM macro cell 110, the operation of the DRAM macro cell can be sped up.

Figure 9:
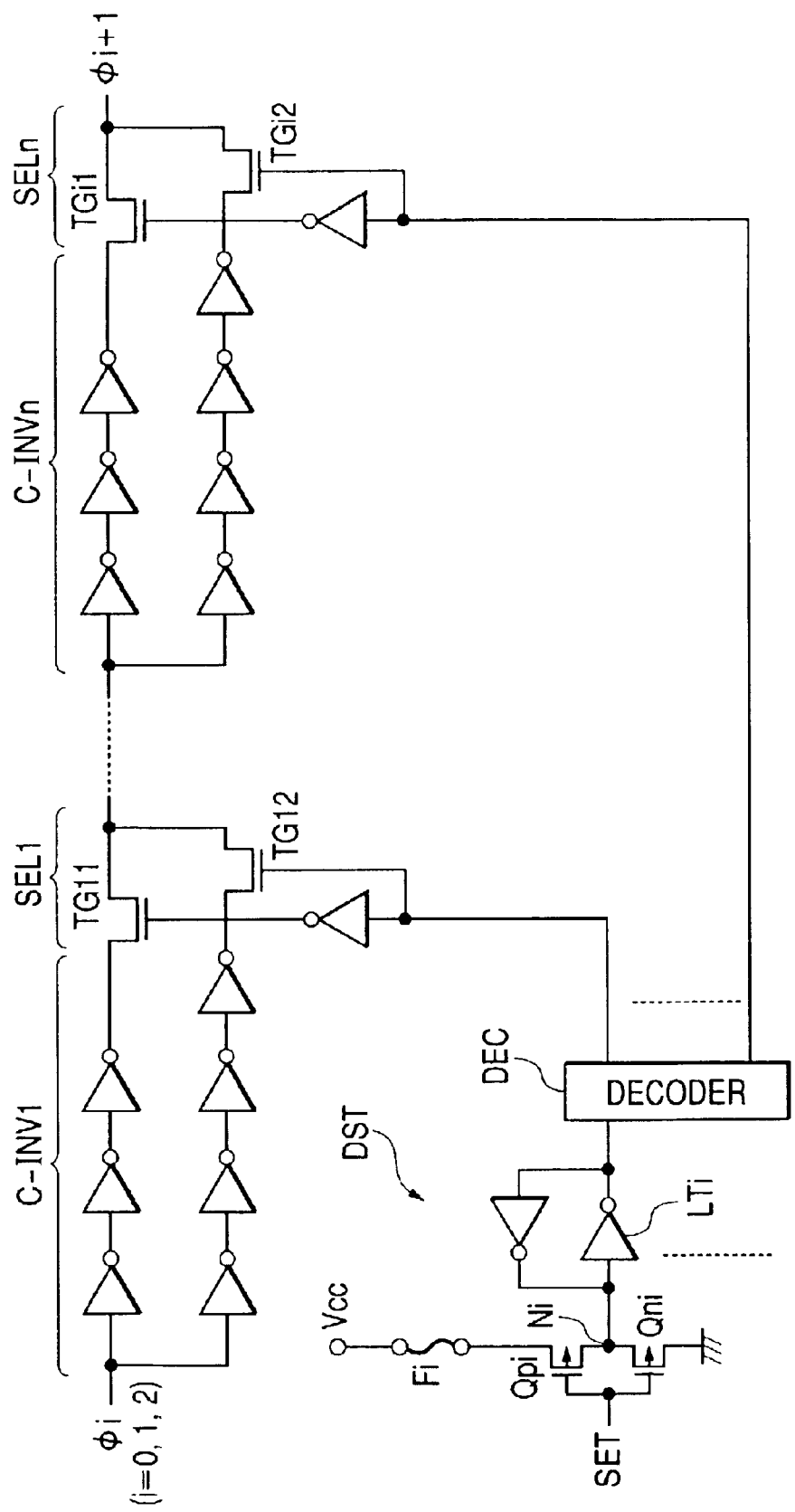
FIG. 9 is a diagram showing a concrete configuration of a variable delay circuit.

FIG. 9 is a diagram showing a concrete circuit example of the variable delay circuits 161 to 163. In this embodiment, inverters are used as delay means, and the variable delay circuits are configured by: a number of inverters connected in series with each other, that is, sets of inverter trains C-INV1, . . . , C-INVn different from each other in delay quantity, switching means (selectors) SEL1, . . . , SELn for deciding whether to pass a clock signal delayed by one inverter train in the sets of the inverter trains; delay quantity setting means DST for setting a delay quantity, depending on a side selected by the switching means; and a decoder DEC for generating a switching control signal for decoding a signal indicating a setting state of the setting means DST to control the switching means SEL1, . . . SELn.

The switching means are comprised of MOSFET TG11, TG12, . . . TGn1, and TGn2 for transmission use. Although, in FIG. 9, one MOSFET symbol is shown as a transmission gate for each inverter train, an actual circuit is preferably comprised of a so-called CMOS transmission gates in which p-channel MOSFETs and n-channel MOSFETs are connected in parallel, to prevent drop in the level of transmitted signals.

The delay quantity setting means DST is comprised of; a fuse device Fi; p-channel MOSFET Qpi and n-channel MOSFET Qni connected in series with the fuse device; and a latch circuit LTi connected to a common drain (node Ni) of the MOSFET Qpi and Qni, and a setting control signal SET can apply to gates of Qpi and Qni. Since there is no relationship between the configuration of the delay quantity setting means DST and signal transmission speed in a signal transmission system, the fuse device Fi, and the MOSFET Qpi and Qni and the latch circuit Lti for detecting a state of the fuse device may be formed in a distant position on the chip.

If the delay quantity setting means DST is supplied with, e.g., a positive control pulse as the setting control signal SET in the state in which the fuse device Fi is not disconnected, in a period during which SET is at a high level, even if the n-channel MOSFET Qni is turned on and the potential of the node Ni drops, when SET returns to a low level, the node Ni is charged through the fuse device Fi and Qpi and its potential is set to a level close to Vcc. Thereby, the latch circuit LTi determines its state, and its output changes to a low level (ground potential) and is inversely fed back by a feedback inverter to hold the output state.

On the other hand, if the delay quantity setting means DST is supplied with, e.g., a positive control pulse as the setting control signal SET in the state in which the fuse device Fi is disconnected, in a period during which SET is at a high level, the n-channel MOSFET Qni is turned on and the node Ni is connected to ground potential. Next, when SET returns to a low level and Qpi is turned on, since the fuse device is disconnected, the node Ni is not charged through Qpi and remains at the ground potential. Thereby, the latch circuit LTi determines its state, and its output changes to a high level (Vcc) and is inversely fed back by a feedback inverter to hold the output state.

In this way, a level held in the latch circuit LTi differs depending on a state of the fuse device Fi. The delay quantity setting means DST is provided with plural sets of the fuse device Fi, CMOS inverters (Qp1, Qn1), and latch circuit LTi, output of the decoder circuit DEC is changed according to combinations of setting states in them, inverter trains through which the clock signal φ1 passes are switched, and a delay quantity is changed.

Figure 10:
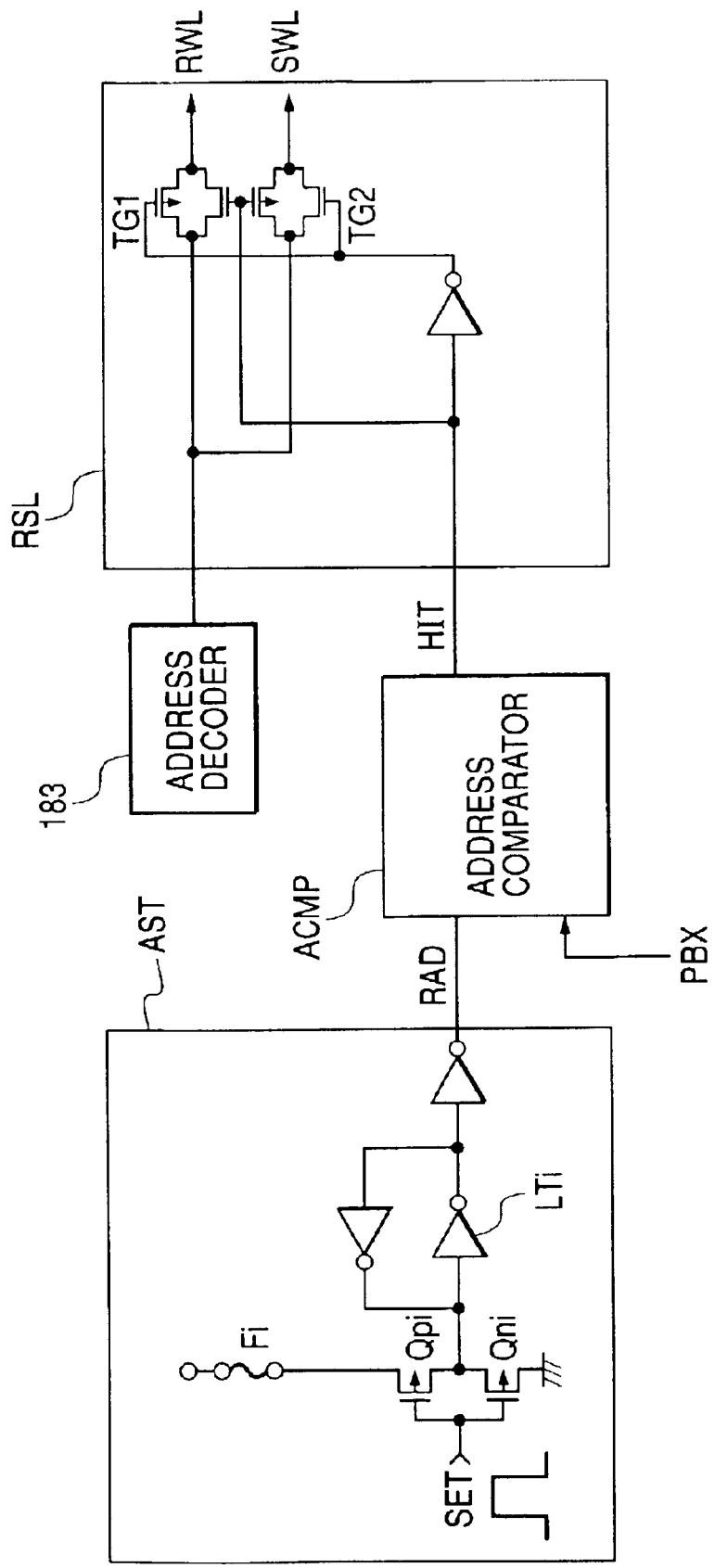
FIG. 10 is a diagram showing a concrete configuration of a redundancy circuit for relieving defective memory cells, provided for each of DRAM macro cells.

FIG. 10 shows a concrete circuit example of a redundancy circuit. In FIG. 10, AST designates a relief address setting means; ACMP designates an address comparing circuit that compares a set relief address RAD and a normal input address RBX, and if they match, outputs a match detection signal HIT; and RSL designates a redundancy selector circuit that, according to the match detection signal HIT, switches a selection signal from the address decoder 183 from a normal word line RWL to a standby word line SWL to which a standby memory cell is connected, and supplies the signal.

The relief address setting means AST comprises: the fuse device Fi; p-channel MOSFET Qpi and n-channel MOSFET Qni connected in series with the fuse device; and the latch circuit LTi connected to a common drain (node Ni) of the MOSFET Qpi and Qni, and the setting control signal SET can apply to gates of Qpi and Qni.

As is apparent from comparison between FIGS. 9 and 10, in this embodiment, the relief address setting means AST and the delay quantity setting means DST have the same configuration. As described later, the fuse device Fi itself also uses an element of identical configuration for the relief address setting means AST and the delay quantity setting means DST. The redundancy selector circuit RSL comprises CMOS transmission gates TG1 and TG2. Since the address comparing circuit ACMP can use the same configuration as address comparing circuits widely used in redundancy circuits of general-purpose memories, the disclosure and description of a concrete circuit example are omitted.

Figure 11A:
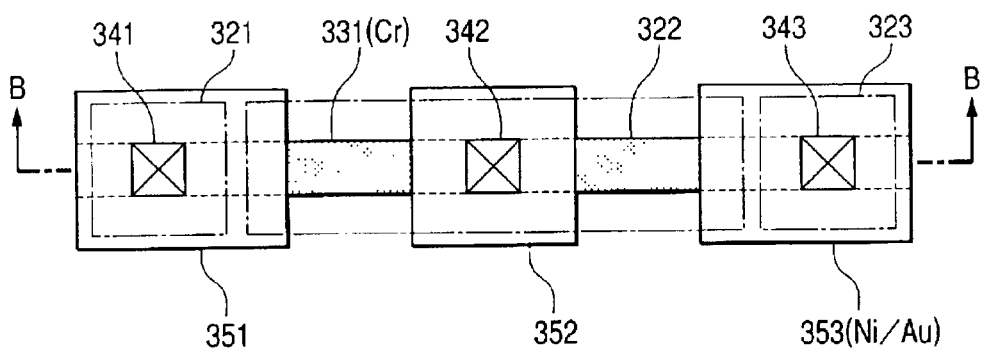
FIGS. 11A and 11B are plan view and a sectional view showing a concrete configuration of a fuse device Fi used in a relief address setting means and a delay quantity setting means of an embodiment.
Figure 11B:
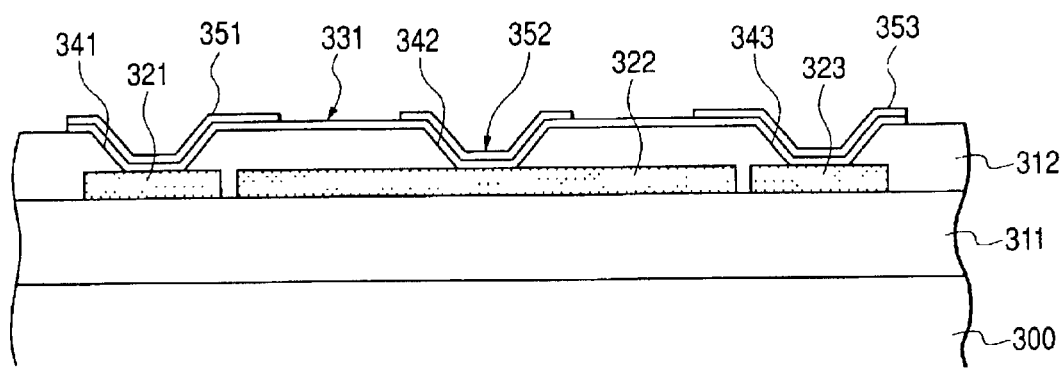

FIG. 11A shows a plan view showing a concrete configuration of the fuse device Fi used in the relief address setting means AST and the delay quantity setting means DST, and a sectional view (FIG. 11B) of the fuse device Fi. In FIG. 11A, an example of integration of two fuse devices is shown. FIG. 11B shows a cross section taken along the line B—B of FIG. 11A.

In FIG. 11B, 300 designates a semiconductor substrate such as monocrystalline silicon; 311, an insulating film formed on the surface of the semiconductor substrate 300; and 321, 322, and 323, aluminum wirings of a top layer formed on the insulating film 311. The central aluminum wiring 322 is a wiring for supplying power source voltage Vcc. Aluminum wirings 321 and 323 at both sides of the central aluminum wiring 322 are wirings for connecting one terminal (a terminal opposite to the power source voltage Vcc) of the fuse device Fi and a source terminal of the MOSFET Qpi in the embodiments of FIGS. 9 and 10.

Above these aluminum wirings 321 to 323 are formed an insulating film 312, on which a chrome film functioning as a fuse device is formed. The chrome film 331 is formed to have a relatively small width as shown in FIG. 11A. This is because too large a width would require much time for cutting. However, too small a width would increase a resistance value and make it impossible to obtain a sufficient level of setting potential (potential of node Ni of FIG. 9). It is desirable to decide a width, taking into account a tradeoff between them and the thickness of the chrome film 331.

On the insulating film 312 are formed contact holes 341, 342, and 343, corresponding to the respective central parts of the aluminum wirings 321, 322, and 323. In the contact holes 341, 342, and 343, parts of a fuse layer formed of the chrome film 331 respectively contact the aluminum wirings 321, 322, and 323. In other words, fuse devices are respectively formed on the chrome film 331 of a portion sandwiched between the contact holes 341 and 342 and the chrome film 332 of a portion sandwiched between the contact holes 342 and 343. Moreover, on the chrome film 331, protective films 351, 352, and 353 formed of multilayered films of nickel and gold are formed to cover the contact holes 341, 342, and 343 and their periphery. The protective films 351, 352, and 353 contribute to prevention of contact failure due to corrosion of the chrome film 331 in the contact holes 341, 342, and 343.

The protective films 351, 352, and 353 are thus formed at a proper interval on the chrome film 331, so that parts of the chrome film 331 are exposed as shown in FIG. 11A. In this embodiment, so-called fuse disconnection processing is performed by irradiating laser light to the exposed parts of the chrome film 331. Since a fuse device constituting the delay quantity setting means DST and a fuse device constituting the relief address setting means AST have the same configuration, the delay quantity setting means DST for adjusting clock delay time can be formed without adding processes.

Figure 12:
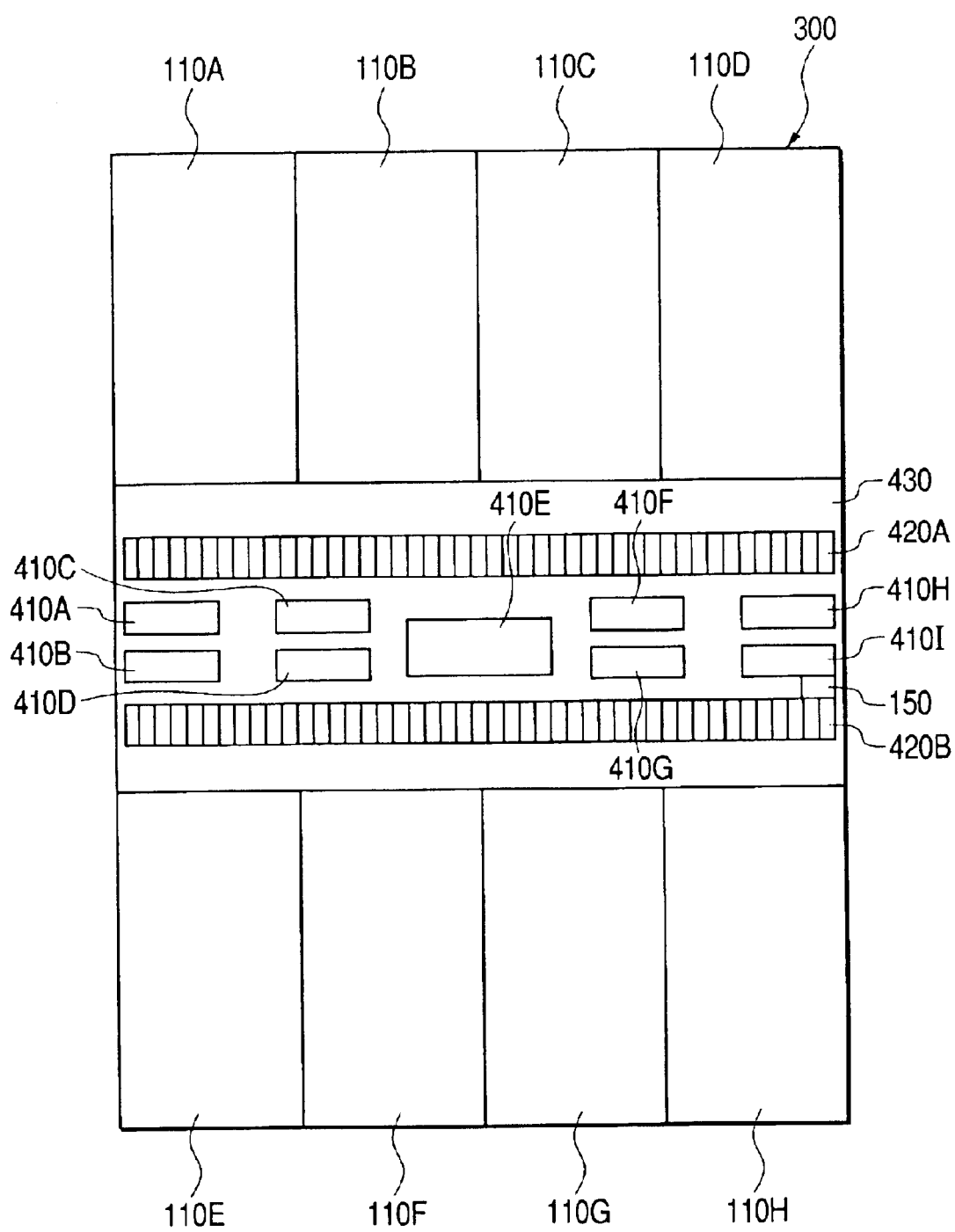
FIG. 12 is a plan view showing a layout of the whole of a cache memory chip to which the present invention is applied.
Figure 13:
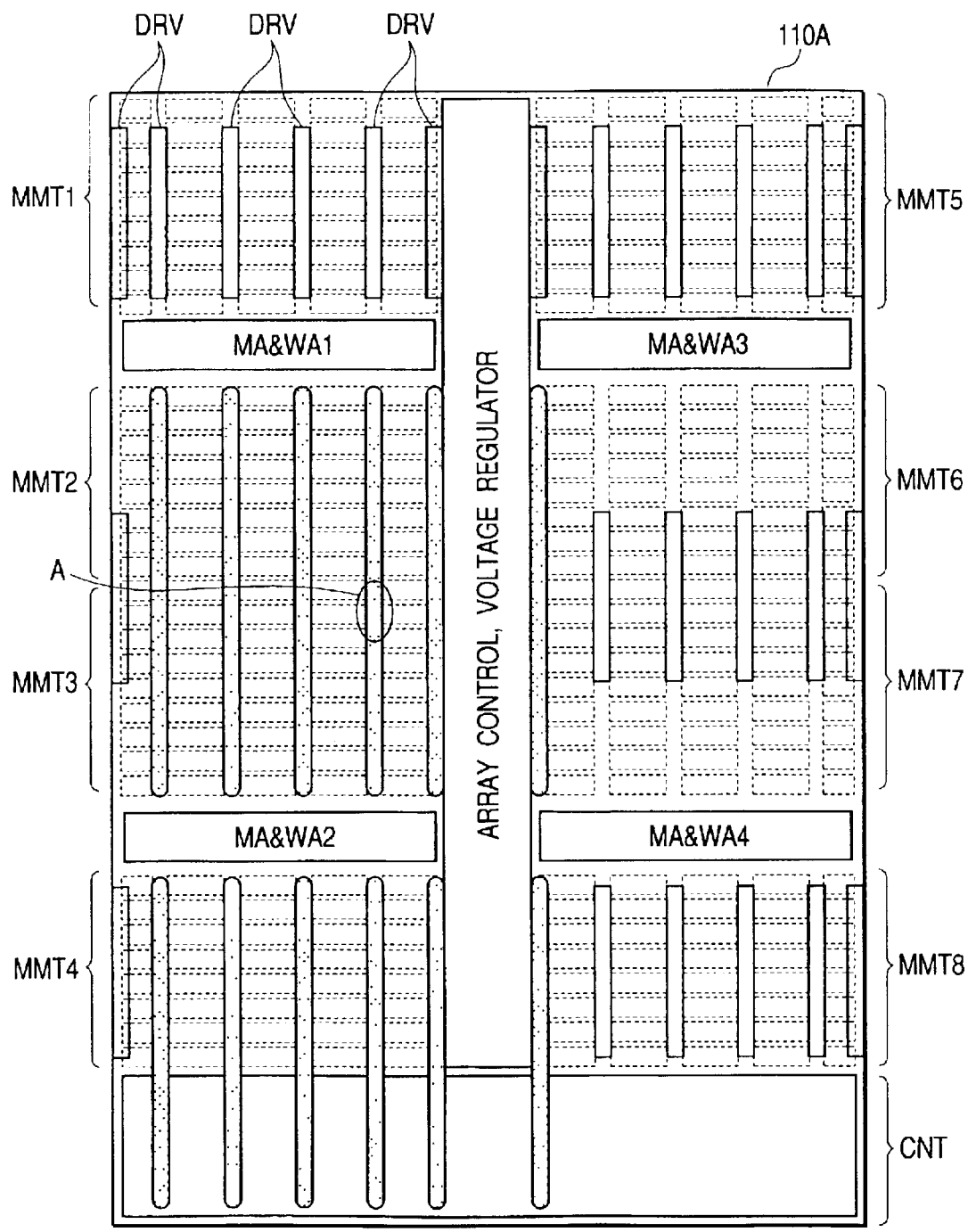
FIG. 13 is a plan view showing a layout of a fuse device on the cache memory chip to which the present invention is applied.

FIGS. 12 and 13 show a layout of a cache memory chip to which the present invention is applied, and a layout of fuse devices on the chip. As shown in FIG. 12, on the cache memory chip are disposed a total of eight DRAM macro cells 110A to 100H, with four in each of the upper and lower portions of the chip 300. In horizontal direction at the center of the chip are disposed two rows of SRAM macro cells 410A to 410I, above and below which I/O cell trains 420A and 420B for signal input and output are respectively disposed. The above described internal clock generating circuit 150 is disposed between the DRAM macro cell 410I and the I/O cell train 420B. In marginal parts 430 except these circuits are disposed logic circuits constituting the latch circuits 131 to 134 and the logic parts 141 to 144. The SRAM macro cells 410A to 410I are used as write buffer 181 and read buffer 182.

FIG. 13 is a diagram showing an enlarged layout of the DRAM macro cell 110A extracted from the DRAM macro cells 110A to 110H shown in FIG. 12.

As shown in FIG. 13, the DRAM macro cell 110A has eight memory blocks MMT1 to MMT8. Of these memory blocks, MMT2 and MMT3, and MMT3 and MMT7 are disposed adjacently to each other. Each of the memory blocks MMT1 to MMT8 is provided with six subword driver trains DRVs for driving word lines, and between the memory blocks MMT1 and MMT2, MMT3 and MMT4, MMT5 and MMT6, and MMT7 and MMT8 are respectively provided amplifier areas MA&WA1 to MA&WA4 in each of which a main amplifier MA for reading and one of write amplifiers WA1 to WA4 for writing are juxtaposed. At the center and one side of the cell (a bottom side in FIG. 13) is provided an area CNT in which a voltage generating circuit, memory peripheral control circuit, and the cell latch circuits 112 and 113 shown in FIG. 2 are disposed.

In this embodiment, fuse arrays FALYs having the structure as shown in FIG. 11 are provided on some subdriver trains DRVs of MMT2, MMT3, and MMT4, and MMT6, MMT7, and MMT8. Optionally, a fuse device is disposed so that a lengthwise direction of the fuse arrays FALYs matches a lengthwise direction of the chrome film 331 of FIG. 11. Of the fuse arrays FALYs, for example, at a location indicated by the symbol A is disposed a fuse device constituting the delay quantity setting means DST shown in FIG. 9. Other fuse devices are used as fuse devices constituting the relief address setting means AST shown in FIG. 10.

As described above, in this embodiment, since a fuse device constituting the delay quantity setting means DST and a fuse device constituting the relief address setting means AST are juxtaposed, fuses can be continuously disconnected by a laser apparatus, providing the advantage of speeding up processing in comparison with the case where the fuses are distant from each other. Since a lengthwise direction of the fuse arrays FALYs matches a lengthwise direction of the chrome film 331 of FIG. 11, laser light may be irradiated to plural fuse devices on one fuse array FALY by moving laser beams in one direction, facilitating alignment control. That is, in the case where two fuse devices are formed on one chrome film as described previously, if the fuse devices are to be disposed so that a lengthwise direction of the chrome film is orthogonal to a lengthwise direction of the fuse array FALY, the fuses are disposed in two rows, in which case a laser beam must be moved in zigzags. In contrast to this, in this embodiment, since a laser beam may be moved in one direction, advantageously, alignment control is facilitated.

The invention by the inventor has been specifically described based on embodiments. The present invention is not limited to the above described embodiments, and it goes without saying that the invention may be modified in various ways without departing from the spirit or scope of the invention.

For example, in the embodiments described previously, a signal is latched on the rising or falling edge of clock and a data transfer from data input to output is performed in an integral multiple of clock cycle. However, as an alternative method, signal latching may be performed on the rising edge and falling edge of clock and a data transfer may be performed in an integral multiple of a half cycle of clock. Accordingly, in that case, since the present invention can be applied by replacing "an integral multiple of clock cycle" by "an integral multiple of half clock cycle", the alternative method should also be interpreted as included in the present invention.

Although, in the embodiment of FIG. 2, the DRAM macro cell is preceded and followed by two latch circuits and two logic parts, the present invention can also apply to the case where the DRAM macro cell is preceded and followed by three or more latch circuits and three or more logic parts.

Although, in the above described embodiments, fuse devices are used to set delay time in the variable delay circuits, the present invention is not limited to this; for example, the setting of delay time, that is, internal clock timing adjustment may be performed using registers, or substituting nonvolatile storage elements used in flash memory or the like as program elements for fuse devices. For use of registers, setting is performed according to an initialize sequence and data setting sequence performed when power is turned on. For use of nonvolatile storage elements, a semiconductor integrated circuit device to which the present invention is applied is connected to a dedicated apparatus such as a memory writer to set data by a write operation.

Although the above description has been primarily made on the case where the invention made by the inventor is applied to a cache memory including DRAM macro cells, which is an application field of the present invention, the present invention is not limited to this; the present invention can be widely used for semiconductor integrated circuit devices including SRAM, nonvolatile flash memories, and other memories, or semiconductor integrated circuit devices including macro cells (e.g., CPU, arithmetic unit, etc.) other than memory and logic circuits.

Of inventions disclosed by the present patent application, effects obtained by representative ones are described below.

According to the present invention, in a semiconductor integrated circuit device that includes a storage circuit and operates synchronously with an external clock, since a data transfer cycle of the storage circuit is set to a non-integral multiple of clock cycle, total delay time from signal input to output can be reduced and the speed of operation can be increased. Since timing can be adjusted after it has been manufactured, the number of design changes and the number of mask modifications are reduced, a development period is remarkably reduced, and yields are increased. Moreover, since program elements for timing adjustment have the same configuration as program elements for memory relief address setting and they are juxtaposed, the semiconductor integrated circuit device can be achieved which allows timing to be adjusted without using much time for processing for process changes and clock timing adjustment, and causes no increase in costs.

What is claimed is:

1. A semiconductor integrated circuit device which has plural circuit blocks coupled in series for signal transmission and operating under control of a clock signal, wherein the plural circuit blocks include a first circuit block that receives input signals in response to a first timing signal based on the clock signal, and a second circuit block that forms output signals in response to a second timing signal based on the clock signal, wherein a time difference between the first timing signal and the second timing signal is set to a period of a non-integral multiple of the cycle of the clock signal, and wherein time from the receipt of an input signal in the first circuit block to the output of a signal formed in the second circuit block is set to an integral multiple of the cycle of the clock signal.

2. A semiconductor integrated circuit device which has plural circuit blocks coupled in series for signal transmission and operating under control of a clock signal, wherein the plural circuit blocks include a first circuit block that receives input signals in response to a first timing signal based on the clock signal, and a second circuit block that forms output signals in response to a second timing signal based on the clock signal, wherein a time difference between the first timing signal and the second timing signal is set to a period of a non-integral multiple of the cycle of the clock signal, wherein a timing signal forming circuit is provided which forms the first timing signal and the second timing signal, based on the clock signal, and wherein the timing signal forming circuit comprises a variable delay circuit including a program element operable for adjusting the time difference between the first timing signal and the second timing signal.

3. The semiconductor integrated circuit device according to claim 2, wherein the program element comprises fuse devices.

4. The semiconductor integrated circuit device according to claim 3, wherein at least one circuit block of the plural circuit blocks has a circuit operation setting element by which a setting of circuit operation of that circuit block can be changed, and wherein the program element in the delay circuit and the circuit operation setting element in the at least one circuit block are configured with the same device configuration as each other.

5. The semiconductor integrated circuit device according to claim 4, wherein the second circuit block comprises a random access memory having a defect relieving circuit, and wherein the program element in the delay circuit and a setting element for holding defect relief information in the defect relieving circuit in the second circuit block are configured with the same device configuration as each other.

6. The semiconductor integrated circuit device according to claim 5, wherein the random access memory comprises a synchronous memory that forms an output after a period exceeding plural times a clock signal cycle from the start of access thereto.

7. The semiconductor integrated circuit device according to claim 6, wherein the synchronous memory comprises a memory having dynamic memory cells.

8. The semiconductor integrated circuit device according to claim 4, wherein the program element in the delay circuit and the setting element for holding defect relief information in the defect relieving circuit in the second circuit block are provided adjacently to each other.

9. The semiconductor integrated circuit device according to claim 8,
wherein the program element in the delay circuit and the setting element for holding defect relief information in the defect relieving circuit in the second circuit block are substantially linearly juxtaposed.

10. A semiconductor integrated circuit device which has plural circuit blocks coupled in series for signal transmission and operating under control of a clock signal,
wherein the plural circuit blocks include a first circuit block and a second circuit block that receive input signals in response to a first timing signal based on the clock signal, and a third circuit block that forms output signals in response to a second timing signal based on the clock signal,
wherein, in a signal transmission system, the third circuit block is provided between the first circuit block and the second circuit block, and
wherein a time difference between the first timing signal and the second timing signal is set to a period of a non-integral multiple of the cycle of the clock signal.

11. The semiconductor integrated circuit device according to claim 10,
wherein the third Circuit block includes a local timing signal generating circuit that generates a third timing signal within the block, based on the second timing signal, and a time difference between the second timing signal and the third timing signal is a non-integral multiple of the cycle of the clock signal.

12. The semiconductor integrated circuit device according to claim 11,
wherein the local timing signal forming circuit has comprises a variable delay circuit including a program element operable for adjusting the time difference between the second timing signal and the third timing signal.

13. The semiconductor integrated circuit device according to claim 11,
wherein the first circuit block and the second circuit block each include a latch circuit that latches input signals to the respective circuit blocks, based on the first timing signal, and the third circuit block includes a latch circuit that latches input signals to the third circuit block, based on the second timing signal.

14. The semiconductor integrated circuit device according to claim 10,
wherein, in the signal transmission system including the first circuit block, the third circuit block, and the second circuit block coupled in series for signal transmission, at least one fourth circuit block is provided in parallel with the third circuit block.

15. The semiconductor integrated circuit device according to claim 14,
wherein the third circuit block and the at least one fourth circuit block have the same circuit configuration, and a signal selecting means for selectively transmitting one of output signals corresponding to the third and the at least one fourth circuit blocks is provided in the second circuit block.

16. The semiconductor integrated circuit device according to claim 10,
wherein a timing signal forming circuit is provided which forms the first timing signal and the second timing signal, based on the clock signal, and
wherein the timing signal forming circuit comprises a variable delay circuit including a program element operable for adjusting the time difference between the first timing signal and the second timing signal.

17. The semiconductor integrated circuit device according to claim 10,
wherein there are provided two external terminals through which the clock signal is inputted, and a clock buffer circuit which receives a differential clock signal inputted to the two external terminals and generates a single-phase clock signal.

18. A semiconductor integrated circuit device which has plural circuit blocks coupled in series for signal transmission and operating under control of a clock signal,
wherein the plural circuit blocks include a first circuit block that receives input signals in response to a first timing signal based on the clock signal, and a second circuit block that forms output signals in response to a second timing signal based on the clock signal,
wherein a time difference between the first timing signal and the second timing signal is set to a period of a non-integral multiple of the cycle of the clock signal,
wherein time from the receipt of an input signal in the first circuit block to the output of a signal formed in the second circuit block is set to an integral multiple of the cycle of the clock signal,
wherein a timing signal forming circuit is provided which forms the first timing signal and the second timing signal, based on the clock signal, and
wherein the timing signal forming circuit comprises a variable delay circuit including a program element operable for adjusting the time difference between the first timing signal and the second timing signal.

* * * * *